United States Patent [19]

Stanford, Jr. et al.

[11] Patent Number: 5,339,844
[45] Date of Patent: Aug. 23, 1994

[54] LOW COST EQUIPMENT FOR CLEANING USING LIQUEFIABLE GASES

[75] Inventors: Thomas B. Stanford, Jr., San Pedro; Sidney C. Chao, Manhattan Beach, both of Calif.

[73] Assignee: Hughes Aircraft Company, Los Angeles, Calif.

[21] Appl. No.: 82,866

[22] Filed: Sep. 7, 1993

Related U.S. Application Data

[63] Continuation-in-part of Ser. No. 927,443, Aug. 10, 1992.

[51] Int. Cl.$^5$ .................... B08B 3/02; B08B 13/00
[52] U.S. Cl. ...................... 134/107; 134/108; 134/109; 134/113; 134/186
[58] Field of Search ................ 134/1, 7, 10, 34, 105, 134/107, 108, 109, 184, 186, 113

[56] References Cited

U.S. PATENT DOCUMENTS

| | | | |
|---|---|---|---|
| 4,832,753 | 5/1989 | Cherry et al. | 134/22.18 |
| 4,906,387 | 3/1990 | Pisani | 210/748 |
| 4,936,922 | 6/1990 | Cherry et al. | 134/22.18 |
| 4,990,260 | 2/1991 | Pisani | 210/664 |
| 5,013,366 | 5/1991 | Jackson et al. | 134/1 |
| 5,102,504 | 4/1992 | Saito | 134/107 X |
| 5,193,560 | 3/1993 | Tanaka et al. | 134/108 X |

*Primary Examiner*—Philip R. Coe
*Attorney, Agent, or Firm*—M. E. Lachman; M. W. Sales; W. K. Denson-Low

[57] ABSTRACT

Precision cleaning of parts is performed with liquefiable gases, such as $CO_2$, without the use of a complex and costly processor system. Rather, simplified and reliable performance for small scale and "low end" cleaning applications is accomplished without the use of pumps and condensers. The apparatus for removing undesired material from a chosen substrate comprises: (a) an enclosed cleaning chamber in a walled vessel for containing a liquid derived from a liquefiable gas and the substrate containing the undesired particulates and contaminants, the walled vessel adapted to withstand a maximum pressure of about 1,500 pounds per square inch (105.4 kg/cm$^2$) at ambient temperature; (b) means for supporting the substrate in the cleaning chamber; (c) ultrasonic energy-producing transducer means attached to the walled vessel within the cleaning chamber; (d) inlet means attached to the walled vessel for introducing the liquefiable gas into the cleaning chamber under a pressure less than about 900 pounds per square inch (63.3 kg/cm$^2$); (e) temperature control means connected to the cleaning chamber for controlling the temperature within the chamber up to about 50° C.; (f) reservoir means for providing the liquefiable gas to the inlet means; (g) means for changing the liquefiable gas to the liquid; and (h) outlet means in the chamber for removing the liquid from the cleaning chamber. The liquid may then be further treated to remove particulates and organic contaminants and either recycled to the cleaning chamber or vented to the atmosphere. The process is especially applicable for general degreasing and particulate removal processes, when high precision cleaning is not required.

16 Claims, 2 Drawing Sheets

LOW COST EQUIPMENT FOR CLEANING USING LIQUEFIABLE GASES

CROSS REFERENCE TO RELATED APPLICATION

The present application is a continuation-in-part of application Ser. No. 07/927,443, filed Aug. 10, 1992.

BACKGROUND OF THE INVENTION

1. Field of the Invention

The present invention relates to the use of supercritical fluids to clean substrates, and, more particularly, to a process and apparatus employing a liquefiable gas, such as liquid carbon dioxide, in combination with ultrasonic cavitation to provide high cleaning efficiency for general degreasing and particulate removal without the need for expensive high pressure equipment.

2. Description of Related Art

Ultrasonic cleaning has been utilized by industry for a number of years. In the conventional processes, the sonicating media are organic solvents, water, or aqueous solutions, and ultrasonic energy is applied to the media to promote cavitation, i.e., the formation of bubbles and their subsequent collapse. Although usually quite adequate for the removal of undesired contamination, both types of solvents have disadvantages. Many substrates require a rigorous drying process following exposure to an aqueous medium, and this is often a time-consuming thermal excursion. The use of organic solvents as sonicating media presents the problem of chemical disposal and is subject to strict regulatory controls. An additional disadvantage relates to handling of the removed contaminant(s), whether organic or particulate. When the contaminant is a controlled material, such as a radioactive particle, once in solution or suspension, its volume is substantially increased, and this presents an additional pretreatment/disposal problem.

In these conventional ultrasonic cleaning processes, transducers are often used to produce the sonic energy. In other processes, a cavitation nozzle may be used. For example, U.S. Pat. No. 4,906,387, issued Mar. 6, 1990, to J. Pisani for "Method for Removing Oxidizable Contaminants in Cooling Water Used in Conjunction with a Cooling Tower" and U.S. Pat. No. 4,990,260, issued Feb. 5, 1991, to J. Pisani for "Method and Apparatus for Removing Oxidizable Contaminants in Water to Achieve High Purity Water for Industrial Use" disclose methods for removing contaminants from water by inducing cavitation in the water to cause the water to dissociate to produce hydroxyl free-radicals which act as oxidizing agents. In the processes of Pisani, ultraviolet radiation is used in combination with cavitation to continue the oxidation process which was initiated by the hydroxyl free-radicals. The cavitation in the Pisani processes is produced by a "critical flow" nozzle.

Another type of cleaning process, utilizing phase shifting of dense phase gases, has been disclosed and claimed in U.S. Pat. No. 5,013,366, issued to D.P. Jackson et al and assigned to the same assignee as the present application. The process employs a dense phase gas at or above the critical pressure. The phase of the dense phase gas is then shifted between the liquid state and the supercritical state by varying the temperature of the dense fluid in a series of steps between temperatures above and below the critical temperature of the dense fluid, while maintaining the pressure above the critical value. Examples of fluids include (1) hydrocarbons, such as methane, ethane, propane, butane, pentane, hexane, ethylene, and propylene; (2) halogenated hydrocarbons, such as tetrafluoromethane, chlorodifluoromethane, and perfluoropropane; (3) inorganics, such as carbon dioxide, ammonia, helium, krypton, argon, sulfur hexafluoride, and nitrous oxide; and (4) mixtures thereof. In alternative embodiments, the dense phase gas may be exposed to ultraviolet (UV) radiation during the cleaning process or ultrasonic energy may be applied during the cleaning process to agitate the dense phase gas and the substrate surface.

In yet another approach to cleaning, components are placed in a cleaning chamber that is maintained at a pressure above ambient atmospheric pressure and a spray of liquid solvent, such as liquid carbon dioxide, under high pressure is directed onto the components so as to dislodge any contaminant particles therefrom. Such an approach is disclosed, for example, in U.S. Pat. Nos. 4,832,753 and 4,936,922 by R.L. Cherry et al. The spray of tiny solvent droplets act as "fluid hammers" to knock very small, submicrometer particles off of the components to be cleaned, dispersing the particles into the chamber where they are carried away by a stream of clean, dry air flowing over the components and through the chamber.

Systems based on supercritical fluid cleaning technology, such as the SUPERSCRUB TM precision cleaning equipment (a trademark of Hughes Aircraft Company), typically include a pressure vessel, a fluid pump, a fluid reservoir, a separator and condenser system, and various valves, transducers, and temperature sensors. The pressure vessel that is employed is capable of containing pressures up to 5,000 psi (351.5 kg/cm$^2$) and temperatures up to about 100° C. This technology provides the conditions required to exceed the critical points of most candidate supercritical fluids, such as nitrogen, oxygen, argon, helium, methane, propane, carbon dioxide, and nitrous oxide. Systems of this nature are expensive. The cost of such systems is well-justified for high precision cleaning; however, for many particulate and organic contaminants, the cleaning process criteria may often be met without using these fluids in their supercritical state.

Thus, a need exists for a system that provides for simplified and reliable performance for small scale and "low end" cleaning applications.

SUMMARY OF THE INVENTION

In accordance with the invention, apparatus for removing undesired material from a chosen substrate comprises:

(a) an enclosed cleaning chamber in a walled vessel for containing a liquid derived from a liquefiable gas and the substrate containing the undesired particulates and contaminants, the walled vessel adapted to withstand a maximum pressure of about 1,500 pounds per square inch (105.4 kg/cm$^2$) at ambient temperature;

(b) means for supporting the substrate in the cleaning chamber;

(c) ultrasonic energy-producing transducer means attached to the walled vessel within the cleaning chamber;

(d) inlet means attached to the walled vessel for introducing the liquefiable gas into the cleaning chamber under a pressure less than about 900 pounds per square inch (63.3 kg/cm$^2$);

(e) temperature control means connected to the cleaning chamber for controlling the temperature within the chamber up to about 50° C.;

(f) reservoir means for providing the liquefiable gas to the inlet means;

(g) means for changing the liquefiable gas to the liquid; and (h) outlet means in the chamber for removing the liquid from the cleaning chamber.

The removed liquid may then be further treated to remove particulates and organic contaminants and either recycled to the cleaning chamber or vented to the atmosphere. The process is especially applicable for general degreasing and particulate removal process, when high precision cleaning is not required.

The advantage of the present invention is that it eliminates the need for a condenser and recycle system, each of which are major cost items of prior art systems. In addition, the pressure rating required for the cleaning chamber of the invention is relatively low (i.e, <1,500 psi, or <105.4 kg/cm$^2$), which substantially reduces its cost over that of typical supercritical cleaning systems. Equipment costs for the present invention are estimated at less than one-half the cost of the prior art systems. The present invention will also permit the application of liquefiable fluid cleaning for remote or inaccessible cleaning applications, and for rapid, small size batch, and semicontinuous processes. Both of these requirements are not easily met with current supercritical fluid cleaning equipment packages.

DESCRIPTION OF THE PREFERRED EMBODIMENTS

The typical equipment requirements for using supercritical fluids results in relatively high capital costs in some cases. The present invention provides for high cleaning efficiency without resorting to the high pressures usually required when employing fluids in their supercritical state.

There are many fluids which are typical candidates for liquefiable fluid cleaning in conjunction with ultrasonic energy. These include nitrogen, oxygen, argon, helium, methane, propane, carbon dioxide, and nitrous oxide.

Figure 1:
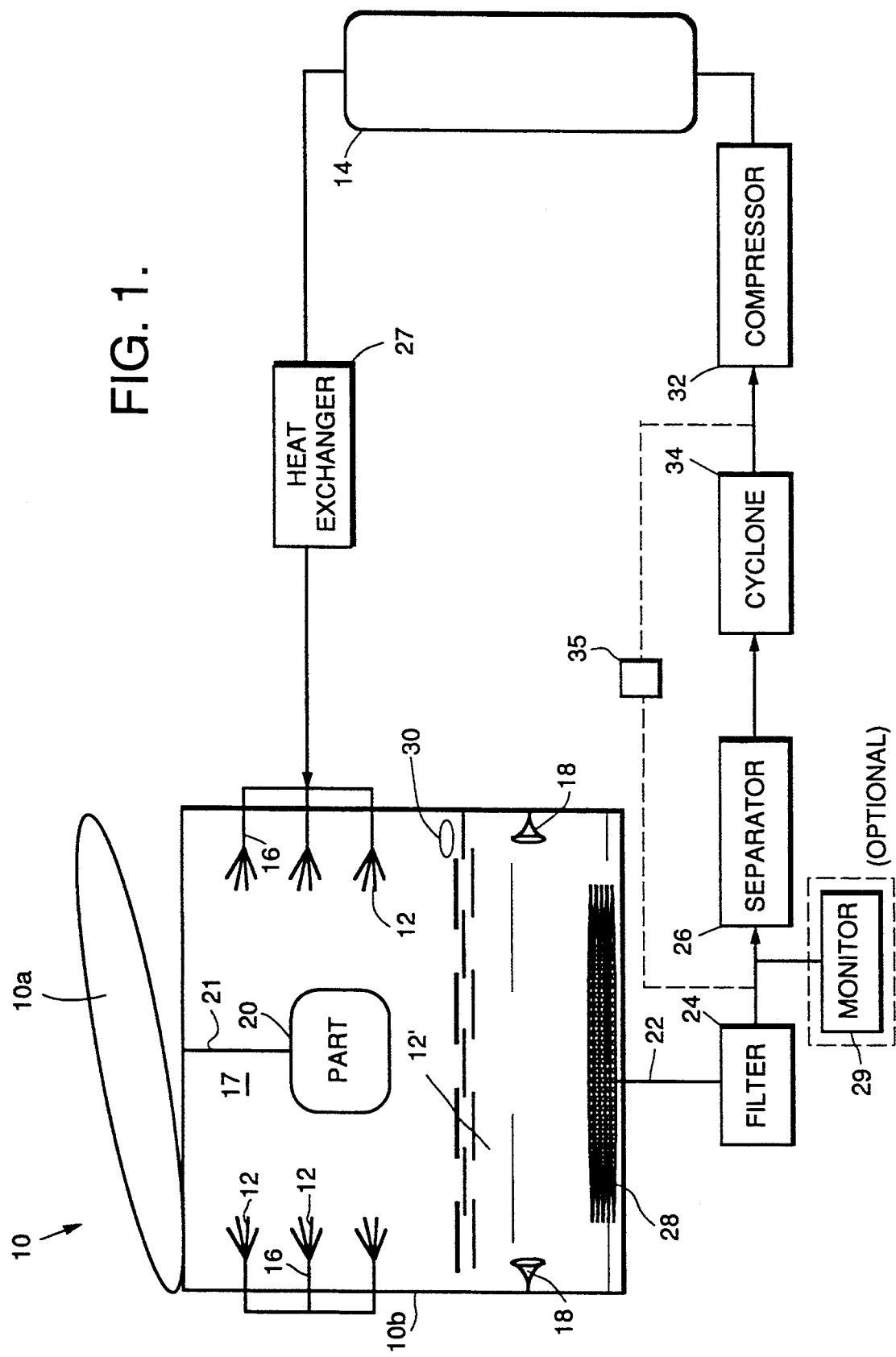
FIG. 1 is a schematic diagram, partly in section, of a first embodiment of apparatus employed in the practice of the invention.
Figure 2:
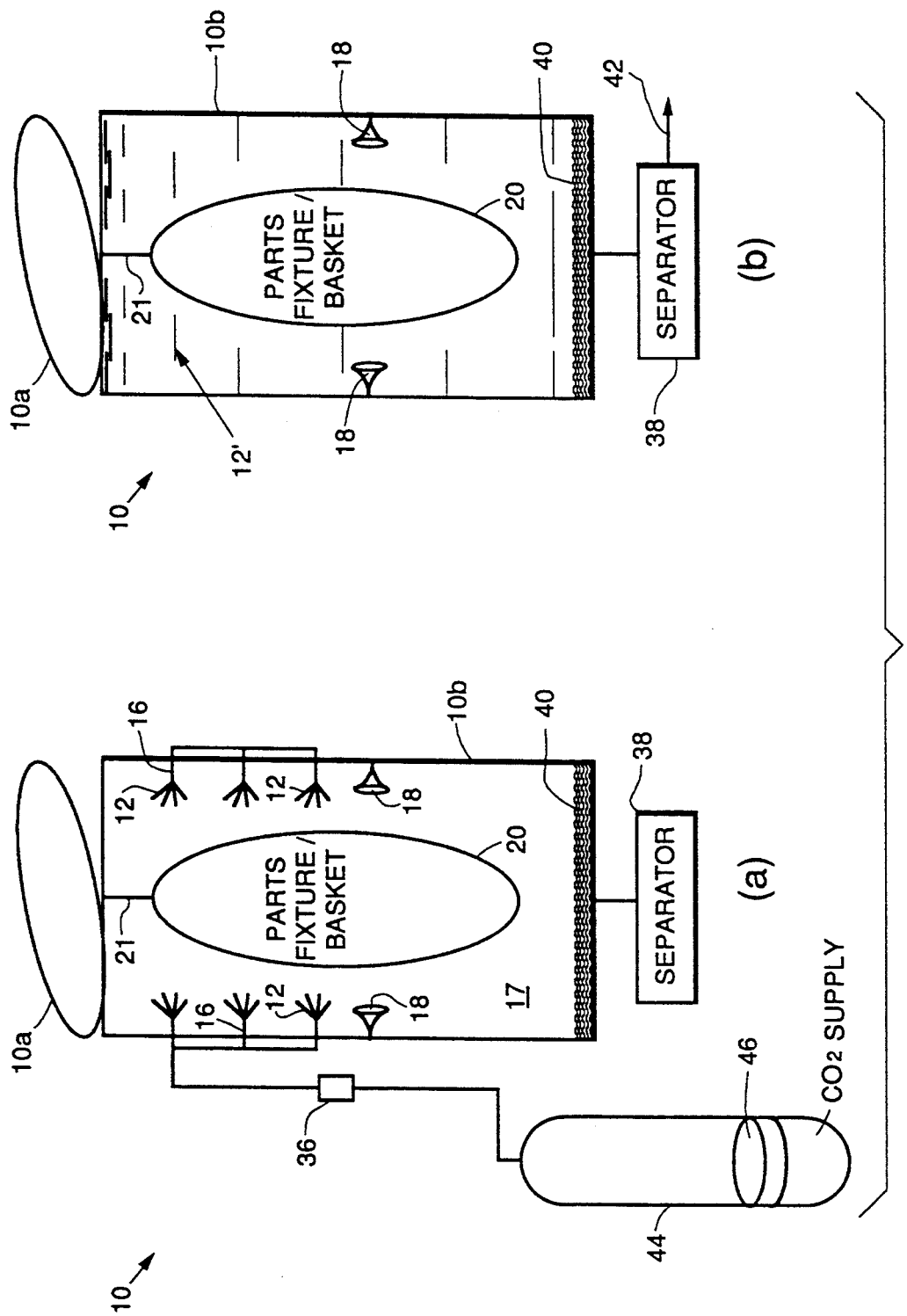
FIG. 2 is a schematic diagram, partly in section, of a second embodiment of apparatus employed in the practice of the invention, showing the apparatus prior to filling with cleaning liquid (FIG. 2A) and filled with cleaning liquid (FIG. 2B).

FIGS. 1 and 2 depict two embodiments of the present invention. In each embodiment, a small (1 to 20 liter) vessel 10 is utilized, provided with a lid 10a. Fluid 12 is supplied from a pressurized reservoir 14 through nozzles 16 along the vessel walls 10b, which define a cleaning chamber 17. Also, the vessel 10 is equipped with an ultrasonic transducer 18. During operation, the vessel 10 is charged with fluid 12 through the nozzles 16. Once charged with fluid 12, ultrasonics are applied to final-clean the part 20 and to remove the last traces of contamination. The part 20 is supported in the vessel 10 by support means 21. Fluid 12 is withdrawn from the vessel 10 through outlet 22 after cleaning and is treated by filters 24 and a separator 26 to remove particulate and organic contamination.

While the following description is presented in terms of employing $CO_2$, other liquefiable fluids may be used in the practice of the invention.

Intermediate Cleaning System

FIG. 1 illustrates the first embodiment, which represents an intermediate version, of the present invention. The steps used in this cleaning process are as follows:

(1) Charge the Vessel with Liquid $CO_2$

The parts 20 to be cleaned are placed in the vessel 10, which is then closed, and $CO_2$ 12 is introduced into the vessel through nozzles 16 in the vessel wall. Initially, snow will be formed, but the state of the fluid 12 is controlled by the temperature in heat exchanger 27. As pressure builds, $CO_2$ is condensed as a liquid 12' using cooling coils 28 in the vessel 10. The liquid $CO_2$ 12' may be above or below the critical point for $CO_2$, which is defined by pressure and temperature. The maximum pressure contemplated by this process is about 1,000 psi (70.3 kg/-cm$^2$), at ambient temperature.

(2) Sonicate In Liquid $CO_2$

After charging with fluid, the temperature is adjusted as required to maintain the liquid state (i.e., 25° C., 800 psi, or 56.2 kg/cm$^2$). The fluid level is adjusted from the reservoir 14 as required to immerse the parts 20, by means of a level indicator 30 in the vessel 10. Sonication is then performed in the liquid $CO_2$ 12' using one or more sonicating horns 18 at a frequency ranging from about 5 to 100 Kilohertz.

(3) Degrease with $CO_2$

The liquid 12' is now heated with heating coils 28 to above 32° C. As an option, this system is equipped with a monitor 29 of the effluent from the vessel. The monitor 29 monitors the particulate and organic contaminant levels. If repeated cleanings are performed, the particulate and organic levels decrease until the part is deemed to be "clean". Steps 2 and 3 are then repeated as determined by the monitor result.

(4) Compression

After cleaning is complete, fluid 12 is recycled and compressed into the reservoir 14, using a compressor 32.

In this first embodiment, cleaning fluid 12 is recycled, but only rough or "first level" purification is performed, instead of the high level provided by the prior art SUPERSCRUB TM precision cleaning equipment. Particulate removal is stepwise, with the final step down to only 10 μm size, before final filtration, to minimize filter clogging and maintenance. large particulates, on the order of 10 to 100 μm, are filtered prior to entry to the separator 26, using filter 24, to provide for easier maintenance and operation. A cyclone separator 34 is used to remove small particulates, on the order of 0.1 to 10 μm, which gives less efficient separation of organic contamination than the known filter/demister approach, but provides for easier maintenance and less down-time. The compressor 32 is used to fill and pressurize the liquid reservoir 14. The pressure of the reservoir serves to fill the vessel 10, completing the fluid cycle. This approach eliminates the need for a liquid pump and condenser, and affords much simpler operation. However, by providing a recycle capability, it is possible to purify the gas supply to ensure that it meets any required cleanliness criteria. In this embodiment, the monitor 29 can be utilized to determined when the part 20 is cleaned, by determining when the liquid 12' contains particulates and contaminants below a predetermined level.

In a modification of the above apparatus, the separator 26 and the cyclone 34 may be by-passed, using instead a pressure reduction valve 35. The valve 35 allows the liquid 12 to expand to the gaseous state, whereafter it is compressed to the liquid state by the compressor 32. (It will be appreciated that the separator 26 includes such a valve 35.) The use of the compressor 32 in either case ensures filling the reservoir 14. In this case, the monitor 29 can be used to determine if the liquid 12 is still useful, by whether the particulate and contaminant levels exceed a predetermined level.

The liquefiable gas may be used with modifiers. Typically a minor percentage (less than about 50 vol/vol percent) of a condensed phase solvent, or modifier, is added to the bulk compressed gas. These modifiers are mixed with the compressed gas to form a non-flammable, non-toxic mixture. The modifiers change the critical point of the mixture so that higher pressures (up to about 1,500 pounds per square inch, or 105.4 Kg/cm$^2$) and temperatures (up to about 50° C.) can be used, which provides improved sonication. In addition, the modifiers change the chemical properties of the condensed gas to improve the solubility properties of the mixture. The modifier or modifiers used depend on the contaminant being removed. For removing polar organic contaminants, a modifier such as iso-propanol or acetone is employed. For removing polar inorganic contaminants, water is desirably employed. For removing low molecular weight non-polar organic ($C_6$ to $C_{18}$) contaminants, a modifier such as hexane may be used. For removing high molecular weight non-polar organic ($>C_{18}$) contaminants, a modifier such as kerosene may be used.

Optionally, any modifier remaining on the surface of the part 20 to be cleaned may be removed following removal of the liquid $CO_2$ from the vessel 10 by introducing $CO_2$ in the supercritical state and sonicating.

Low End Cleaning System

The second embodiment of the present invention, depicted in FIG. 2, is intended for low end (i.e., low-cost) use, with irregular, frequent and small batch size requirements and when stringent purity criteria for the supply fluid 12 are not required. This embodiment constitutes the bare minimum for liquefiable fluid cleaning, and provides for the ultimate in simplicity, flexibility and cost effective operation. The steps used in this process are as follows:

(1) Charge the Vessel with Liquid $CO_2$

The parts 20 to be cleaned are placed in the vessel 10, which is then closed, and $CO_2$ 12 is introduced into the vessel through nozzles 16 in the vessel wall. Initially, snow may be formed, but is replaced with liquid 12' to charge the vessel. As above, the physical state of the fluid is controlled by temperature, using a heat exchanger 36.

(2) Sonicate In Liquid $CO_2$

Final cleaning is accomplished with ultrasonics, as described above. FIG. 2B shows the liquid $CO_2$ 12' filling the vessel 10.

(3) Vent

After sonicating, the fluid 12 is vented through a separator 38 to remove the organic and particulate contaminants. Prior to venting through the separator 38, large particulates (10 to 100 μm) are removed by filter 40 in the bottom of the vessel 10.

This second embodiment, like the first embodiment, also supplies fluid 12 into the vessel 10 through internal nozzles 16. However, this second embodiment does not recycle the fluid 12, but instead vents it to the atmosphere by exhaust means 42 after removal of particulate and organic contaminants in the separator 38.

Pressurization of the vessel 10 is accomplished with tank or cylinder pressure from the $CO_2$ supply source 44 only. Pressure is increased by heating the $CO_2$ in the tank 44 by means of a heater 46. Typically, the temperature of the $CO_2$ is maintained at about 30° C., providing a pressure of about 1,000 psi (70.3 kg/cm$^2$). This eliminates the need for a reservoir 14 (as shown in FIG. 1) and pump and reduces the system's upper pressure requirement, thereby resulting in much simpler and less expensive process equipment. However, this approach limits the process to subcritical conditions, which means that the cleaning advantages of the supercritical state cannot be used. In this embodiment, cleaning efficiency in liquid $CO_2$ 12' is optimized through the use of ultrasonics, which overcomes the cleaning efficiency shortcomings of using the less powerful solvent.

The present invention is applicable to many processes involving liquefiable fluids for precision cleaning, extractions, particulate removal, and degreasing. Exemplary applications include cleaning during manufacture of contact lenses, fuel injectors, engine blocks, watches, small electrical appliances, and razor blades, bearing degreasing, and engine repair shops.

Thus, there has been disclosed a process for removing contaminants from substrates, using liquefied gas. It will be appreciated by those skilled in the art that various modifications and changes of an obvious nature may be made without departing from the scope of the invention, and all such modifications and changes are intended to fall within the scope of the invention, as defined by the appended claims.

What is claimed is:

1. Apparatus for removing undesired particulates and contaminants from a major surface of a chosen substrate comprising:

(a) an enclosed cleaning chamber in a walled vessel for containing a liquid derived from a liquefiable gas and said substrate containing said undesired particulates and contaminants, said walled vessel adapted to withstand a maximum pressure of about 1,500 pounds per square inch (105.4 kg/cm$^2$) at ambient temperature;

(b) means for supporting said substrate in said cleaning chamber;

(c) ultrasonic energy-producing transducer means attached to said walled vessel within said cleaning chamber;

(d) inlet means attached to said walled vessel for introducing said liquefiable gas into said cleaning chamber under a pressure less than about 900 pounds per square inch (63.3 kg/cm$^2$);

(e) temperature control means connected to said cleaning chamber for controlling the temperature within said chamber up to about 50° C.;

(f) reservoir means for providing said liquefiable gas to said inlet means;

(g) means for changing said liquefiable gas to said liquid; and (h) outlet means in said cleaning chamber for removing said liquid from said cleaning chamber.

2. The apparatus of claim 1 further including filtering means for removal of particulates from said liquid, said filtering means associated with said outlet means.

3. The apparatus of claim 2 wherein said apparatus comprises a closed, recycling system, with said filtering means associated with said outlet means for removal of particulates on the order of 10 to 100 $\mu$m from said liquid after removal from said cleaning chamber, wherein said means for providing said liquid from said liquefiable gas comprises a compressor means between said filtering means and said reservoir means for ensuring that said liquefiable gas is in its liquid state, said apparatus further including a heat exchanger between said reservoir means and said inlet means for controlling the temperature of said liquid prior to introduction thereof into said cleaning chamber.

4. The apparatus of claim 3 further including a pressure reduction valve between said filtering means and said compressor means for converting said filtered liquid to its gaseous state.

5. The apparatus of claim 3 further including (a) a separator means following said filtering means and before said compressor means for (1) removing particulates on the order of 0.1 to 1 $\mu$m and organic matter from said liquid and (2) converting said filtered liquid to its gaseous state, and (b) a cyclone means for removing small particulates.

6. The apparatus of claim 3 further including monitoring means for monitoring particulate and organic contaminant levels, said monitoring means associated with said outlet means to monitor said liquid after removal thereof from said cleaning chamber.

7. The apparatus of claim 2 wherein said apparatus comprises a vented system, with said filtering means associated with said outlet means for removal of particulates on the order of 10 to 100 $\mu$m from said liquid prior to removal from said cleaning chamber.

8. The apparatus of claim 7 further including a separator associated with said outlet means for removal of particulates on the order of 0.1 to 1 $\mu$m from said liquid following passage of said liquid through said filter and prior to venting.

9. The apparatus of claim 7 further including a heating means within said reservoir for heating said liquefiable gas contained therein.

10. Apparatus for removing undesired particulates and contaminants from a major surface of a chosen substrate, said apparatus comprising a closed, recycling system comprising:
(a) an enclosed cleaning chamber in a walled vessel for containing a liquid derived from a liquefiable gas and said substrate containing said undesired particulates and contaminants, said walled vessel adapted to withstand a maximum pressure of about 1,500 pounds per square inch (105.4 kg/cm$^2$) at ambient temperature;
(b) means for supporting said substrate in said cleaning chamber;
(c) ultrasonic energy-producing transducer means attached to said walled vessel within said cleaning chamber;
(d) inlet means attached to said walled vessel for introducing said liquefiable gas into said cleaning chamber under a pressure less than about 900 pounds per square inch (63.3 kg/cm$^2$);
(e) temperature control means connected to said cleaning chamber for controlling the temperature within said chamber up to about 50° C.;
(f) reservoir means for providing said liquefiable gas to said inlet means;
(g) outlet means in said chamber for removing said liquid from said cleaning chamber;
(h) filtering means for removal of particulates from said liquid, said filtering means associated with said outlet means for removal of particulates on the order of 10 to 100 $\mu$m from said liquid after removal from said cleaning chamber;
(i) a compressor means between said filtering means and said reservoir means for ensuring that said liquefiable gas is in liquid form; and
(j) a heat exchanger between said reservoir means and said inlet means for controlling the temperature of said liquid.

11. The apparatus of claim 10 further including a pressure reduction valve between said filtering means and said compressor means for converting said filtered liquid to its gaseous state.

12. The apparatus of claim 10 further including (a) a separator means following said filtering means and before said compressor means for (1) removing particulates on the order of 0.1 to 1 $\mu$m and organic matter from said liquid and (2) converting said filtered liquid to its gaseous state, and (b) a cyclone means for removing small particulates.

13. The apparatus of claim 10 further including monitoring means for monitoring particulate and organic contaminant levels, said monitoring means associated with said outlet means to monitor said liquid after removal thereof from said cleaning chamber.

14. Apparatus for removing undesired particulates and contaminants from a major surface of a chosen substrate comprising a vented system comprising:
(a) an enclosed cleaning chamber in a walled vessel for containing a liquid derived from a liquefiable gas and said substrate containing said undesired particulates and contaminants, said walled vessel adapted to withstand a maximum pressure of about 1,500 pounds per square inch (105.4 kg/cm$^2$) at ambient temperature;
(b) means for supporting said substrate in said cleaning chamber;
(c) ultrasonic energy-producing transducer means attached to said walled vessel within said cleaning chamber;
(d) inlet means attached to said walled vessel for introducing said liquefiable gas into said cleaning chamber under a pressure less than about 900 pounds per square inch (63.3 kg/cm$^2$);
(e) temperature control means connected to said cleaning chamber for controlling the temperature within said chamber up to about 50° C.;
(f) reservoir means for providing said liquefiable gas to said inlet means;
(g) means for changing said liquefiable gas to said liquid;
(h) outlet means in said chamber for removing said liquid from said cleaning chamber; and
(i) filtering means associated with said outlet means for removal of particulates on the order of 10 to 100 $\mu$m from said liquid prior to removal from said cleaning chamber.

15. The apparatus of claim 14 further including a separator associated with said outlet means for removal of particulates on the order of 0.1 to 1 $\mu$m from said liquid following passage of said liquid through said filter.

16. The apparatus of claim 14 further including a heating means within said reservoir for heating said liquefiable gas contained therein.

* * * * *